United States Patent
Nakano

[11] Patent Number: 5,539,227
[45] Date of Patent: Jul. 23, 1996

[54] MULTI-LAYER WIRING

[75] Inventor: Hirofumi Nakano, Itami, Japan

[73] Assignee: Mitsubishi Denki Kabushiki Kaisha, Tokyo, Japan

[21] Appl. No.: 510,184

[22] Filed: Aug. 2, 1995

Related U.S. Application Data

[63] Continuation of Ser. No. 156,646, Nov. 24, 1993, abandoned.

[51] Int. Cl.$^6$ .......................... H01L 23/535; H01L 29/43
[52] U.S. Cl. .......................... 257/276; 257/758; 257/763; 257/776
[58] Field of Search .......................... 257/276, 758–760, 257/776, 750, 211, 763, 734

[56] References Cited

U.S. PATENT DOCUMENTS

| | | | |
|---|---|---|---|
| 3,890,636 | 6/1975 | Harada et al. | 257/752 |
| 4,933,743 | 6/1990 | Thomas et al. | 257/776 |
| 5,095,352 | 3/1992 | Noda et al. | 257/211 |
| 5,171,713 | 12/1992 | Matthews | 437/189 |

FOREIGN PATENT DOCUMENTS

| | | | |
|---|---|---|---|
| 0171845 | 6/1992 | Japan | 257/776 |
| 0346460 | 12/1992 | Japan | 257/776 |

OTHER PUBLICATIONS

Inoue et al, "A Rh/Au/Rh Rigid Air–Bridge Interconnection Technique for Ultra–High Speed GaAs LSIs", 1990 IEEE, pp. 253–256.

*Primary Examiner*—Peter Toby Brown
*Attorney, Agent, or Firm*—Leydig, Voit & Mayer

[57] ABSTRACT

A method of producing a multi-layer wiring, first kind layer wirings formed on a semiconductor substrate are covered by an insulating film, a part of a second kind layer wiring is formed at a prescribed region of the surface of the insulating film, and, thereafter, the remaining part of the second kind layer wiring and the third kind layer wiring are formed in the same process so that the remaining part of the second kind layer wiring and the first kind layer wiring cross each other in an airbridge structure and the third kind layer wiring and a part of the second kind layer wiring also cross each other in an airbridge structure. The portion of the second kind layer wiring other than the portion that crosses with the third kind layer wiring in an airbridge structure, is produced with the first kind layer wiring in an airbridge structure in the process of producing the third kind layer wiring. Therefore, at least one of the crossing parts between the first kind layer wiring and the second kind layer wiring can be formed in an airbridge structure, and as a result, a multi-layer wiring that has reduced inter-layer capacitance over all of the multi-layer wiring structure is obtained by the number of process steps as in the prior art.

5 Claims, 4 Drawing Sheets

MULTI-LAYER WIRING

This disclosure is a continuation of patent application Ser. No. 08/156,646, filed Nov. 24, 1993, now abandoned.

FIELD OF THE INVENTION

The present invention relates to multi-layer wiring and a production method thereof and, more particularly, to reducing inter-wiring capacitance relative to the prior art.

BACKGROUND OF THE INVENTION

FIGS. 3(a) through 4(b) show cross-sectional views in a prior art production process of a multi-layer wiring. In these figures, reference numeral 1 designates a semiconductor substrate on a prescribed region of which semiconductor elements such as FETs, which are not shown here, are formed. First kind layer wirings 2a and 2b on the semiconductor substrate 1 are, for example, electrodes of the FETs. An insulating film 3 is formed covering the first kind layer wirings 2a and 2b on the semiconductor substrate 1 as an inter-layer insulating film. A second kind layer wiring 4 is, for example, a power supply line, and this second kind layer wiring 4 is formed by patterning the second kind layer wiring layer 4a. A photoresist pattern 5 is used as a mask when the second kind layer wiring layer 4a is patterned to a prescribed pattern. A photoresist 6 is used for separating the lower layer wiring and the upper layer wiring When producing an airbridge structure. A gilding feeding layer 7 is provided so as to supply an electric current for plating. A resist pattern 8 is provided as a mask when producing a third kind layer wiring 9. This third kind layer wiring 9 is produced by gilding, and functions, for example, as a signal line. Reference numeral 8a designates an aperture of the resist pattern 8. Here, the first kind layer wiring 2a, 2b, the second kind layer wiring 4, and the third kind layer wiring 9 are formed by different processes, and used as wirings for different functions.

A description is given of the production process of the multi-layer wiring with reference to FIGS. 3(a) through 4(b).

After forming the first kind layer wirings 2a, 2b at prescribed regions at the surface of the semiconductor substrate 1, an insulating film 3 is formed on the entire surface of the semiconductor substrate 1 covering the first kind layer wirings 2a and 2b. Thereafter, the wiring metal layer 4a comprising such as a lamination of Ti/Au, is deposited on the entire surface of the insulating film 3 by sputtering, and thereafter, a resist pattern 5 is formed at a prescribed region of the metal layer lamination 4a, thereby resulting the state of FIG. 3(a).

Next, the wiring layer metal layer 4a is patterned by ion milling employing the resist pattern 5 as a mask, thereby producing a second kind layer wiring 4, and thereafter, the resist pattern 5 is removed, resulting in the state shown in FIG. 3(b).

Next, a resist 6 is deposited covering the second kind layer wiring 4 and the insulating film 3, and thereafter, a gilding feeding layer 7 comprising, for example, a lamination of Ti/Au is deposited on the entire surface of the resist 6, and further, a resist pattern 8 is produced at the surface of the gilding feeding layer 7, resulting in the state shown in FIG. 3(c).

Next, as shown in FIG. 4(a), the resist pattern 8 is employed as a mask for electrolytic plating, thereby forming a third kind layer wiring 9 comprising, for example, Au at the aperture 8a of the-resist pattern 8.

Next, after the resist pattern 8 is removed, the gilding feeding layer 7 is removed by ion milling, and further the resist 6 is removed, thereby resulting a multi-layer wiring in which the first kind layer wiring 2 and the second kind layer wiring 4 are separated by the insulating film 3 and the second kind layer wiring 4 and the third kind layer wiring 9 are separated in the airbridge structure. Although only one second kind layer wiring and one third kind layer wiring are illustrated, and only one crossing part of the wirings is illustrated here, the second kind layer wiring and the third kind layer wiring are usually formed in plurality since the first kind layer wiring, and the crossing part of the second kind layer wiring and the third kind layer wiring and the crossing part of the first kind layer wiring and the second kind layer wiring are formed in plurality.

The multi-layer wiring of the prior art semiconductor device is produced as described above, and it is possible to construct the crossing part of the second kind layer wiring and the third kind layer wiring in an airbridge structure, and thereby it is possible to significantly reduce the inter-wiring capacitance between these two wirings. However, because the crossing part of the first kind layer wiring and the second kind layer wiring on the semiconductor substrate is separated only by the insulating film between these two wirings, it was impossible to sufficiently reduce the inter-layer capacitance.

SUMMARY OF THE INVENTION

It is an object of the present invention to provide a multi-layer wiring that is formed in an airbridge structure not only for the crossing part between the second kind layer wiring and the third kind layer wiring on the semiconductor substrate but also for at least one of the crossing part of the first kind layer wiring and the second kind layer wiring.

It is another object of the present invention to provide a method of forming a multi-layer wiring with fewer process steps than the prior art.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a multi-layer wiring and a production method thereof of the present invention, a first kind layer wiring formed on a semiconductor substrate is covered by an insulating film, and a portion of a second kind layer wiring is formed at a prescribed region of the surface of the insulating film, then, the remaining portion of the second kind layer wiring and a third kind layer wiring are formed in the same process so that the remaining part of the second kind layer wiring and the first kind layer wiring cross each other in an airbridge structure and the third kind layer wiring and a portion of the second kind layer wiring, cross each other in an airbridge structure. The other remaining portion of the second kind layer wiring other than the portion that crosses the third kind layer wiring in an airbridge structure, is formed in an airbridge structure crossing the first kind layer wiring in producing the third kind layer wiring. Therefore, at least one of the crossing parts between the first kind layer wiring and the second kind layer wiring can be made into an airbridge structure, thereby obtaining a multi-layer wiring that has reduced the interlayer capacitance in the entirety of the multi-layer wiring structure by the same number of process steps as in the prior art.

DETAILED DESCRIPTION OF THE PREFERRED EMBODIMENT

Figure 1A:
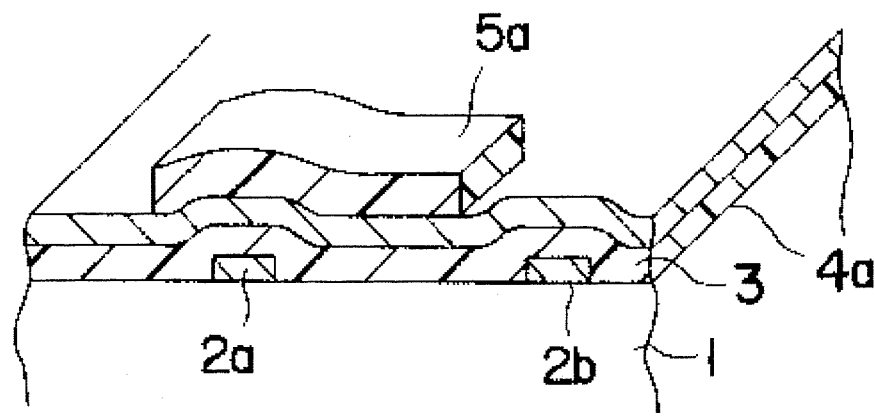
FIGS. 1(a)–1(c) are diagrams showing cross-sectional and perspective views of a part of a production process of multi-layer wiring in a semiconductor device according to a first embodiment of the present invention.

FIGS. 1(a)–1(c) and 2(a)–2(d) are diagrams showing cross-sectional and perspective views of a first and second parts of a production process of multi-layer wiring in a semiconductor device according to a first embodiment of the present invention.

In the figures, the same reference numerals used in FIGS. 3(a) through 4(b) are used to designate the same or corresponding elements. A first second kind layer wiring 4b functioning as a power supply line is provided. This first second kind layer wiring 4b is formed from a wiring metal layer 4a. A resist pattern 5a is employed as a mask for processing the wiring metal layer 4a to form the first second kind layer wiring 4b. A resist pattern 6a is employed as a mask for forming an airbridge structure. An aperture 6b is produced in the resist pattern 6a. A resist pattern 8b is provided as a mask for forming a third kind layer wiring 9. Apertures 8a and 8c are those produced in the resist pattern 8b. A second second kind layer wiring 9a is formed connected to the first second kind layer wiring 4b. The second second kind layer wiring 9a and the third kind layer wiring 9 are produced by the same process, and in view of the manufacturing process, it may also be called a third kind layer wiring 9a. However, since this wiring is provided connected to the first second kind layer wiring 4b and has the same function as the second kind layer wiring 4 in the prior art device shown in FIGS. 3 and 4, this is called as a second second kind layer wiring.

Figure 2A:
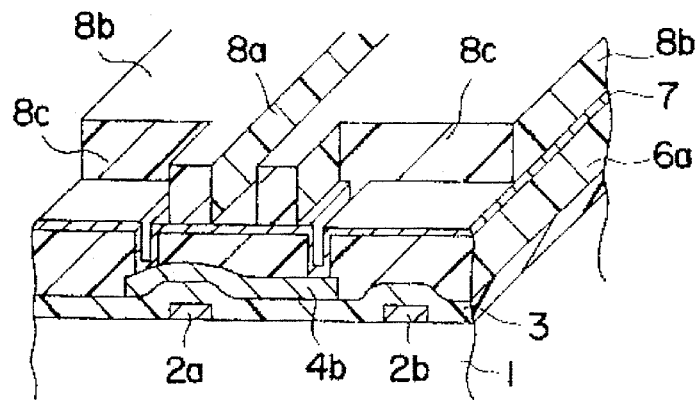
FIGS. 2(a)–2(d) are diagrams showing cross-sectional and perspective views of the other part of the production process of multi-layer wiring in the semiconductor device according to the first embodiment of the present invention.
Figure 2B:
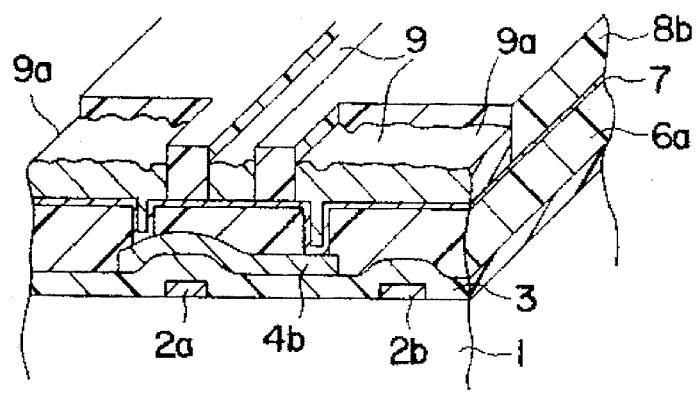
Figure 2C:
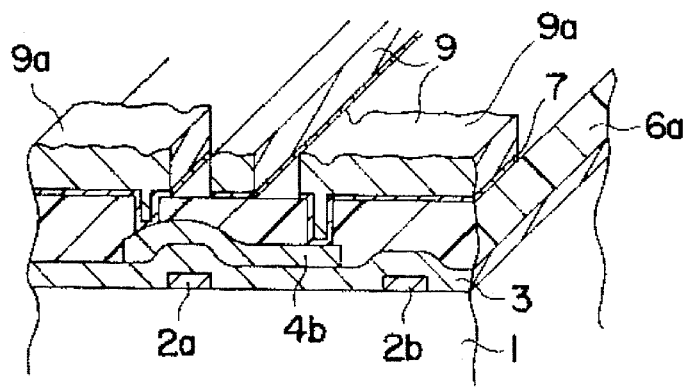
Figure 2D:
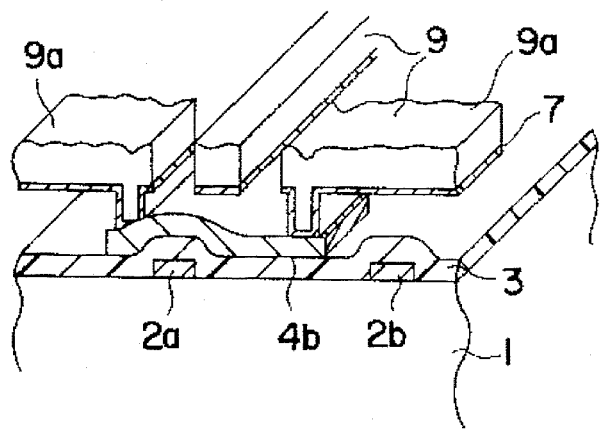
Figure 3A:
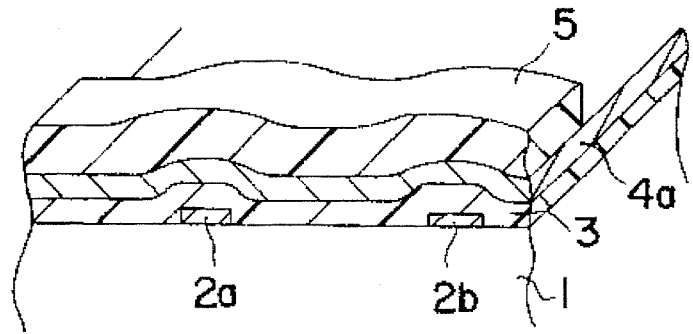
FIGS. 3(a)–3(c) are diagrams showing cross-sectional and perspective views of a part of a production process of multi-layer wiring in a semiconductor device according to the prior art.
Figure 3B:
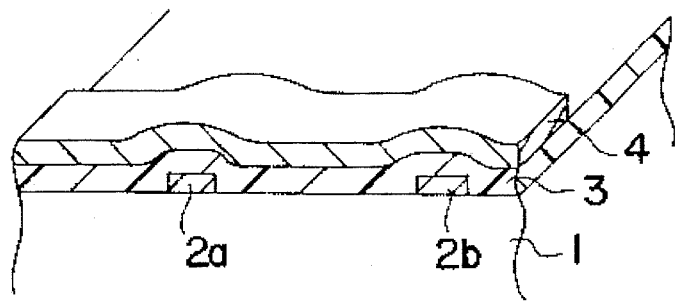
Figure 3C:
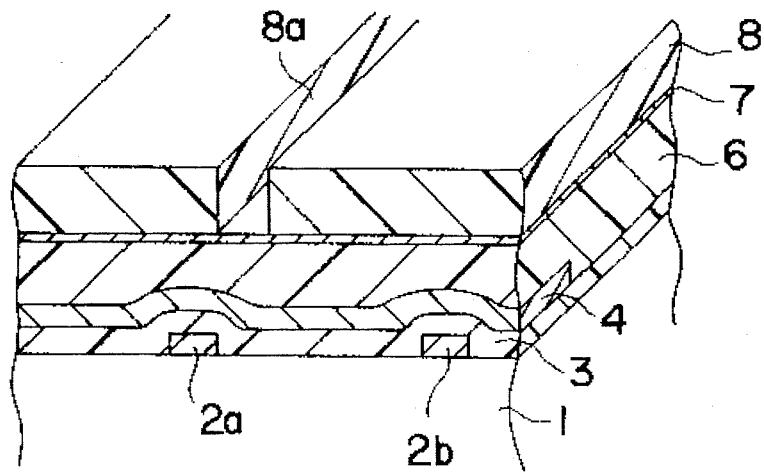
Figure 4A:
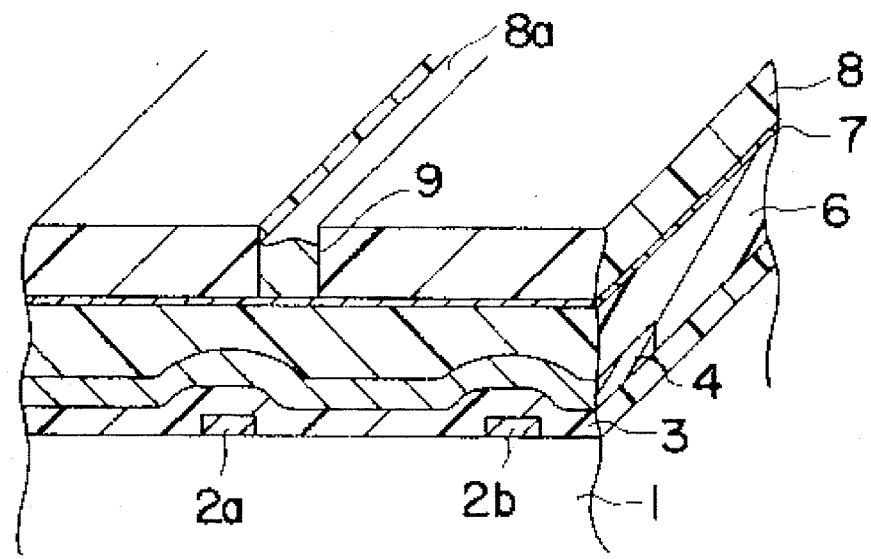
FIGS. 4(a)–4(b) are diagrams showing cross-sectional and perspective views of the other part of the production process of multi-layer wiring in the semiconductor device according to the prior art.
Figure 4B:
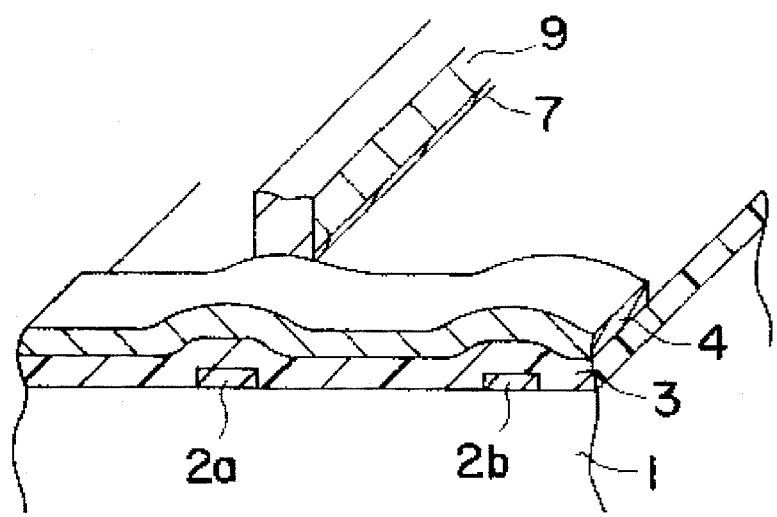

A description is given of the manufacture process of the multi-layer wiring with reference to FIGS. 1(a) and 2(d).

First of all, first kind layer wirings 2a and 2b comprising laminations of Ti/Au are formed at prescribed regions on the semiconductor substrate 1, and then an insulating film 3 comprising, for example, $SiO_2$ is formed so as to cover the first kind layer wirings 2a and 2b.

Subsequently, a wiring metal layer 4a comprising laminations of Ti/Au is deposited on the entire surface of the insulating film 3 by sputtering, and thereafter, a resist pattern 5a of a predetermined length is formed on a prescribed region of the surface of the wiring metal layer 4a, crossing the first kind layer wiring 2a via the insulating film 3, resulting in the state shown in FIG. 1(a).

Figure 1B:
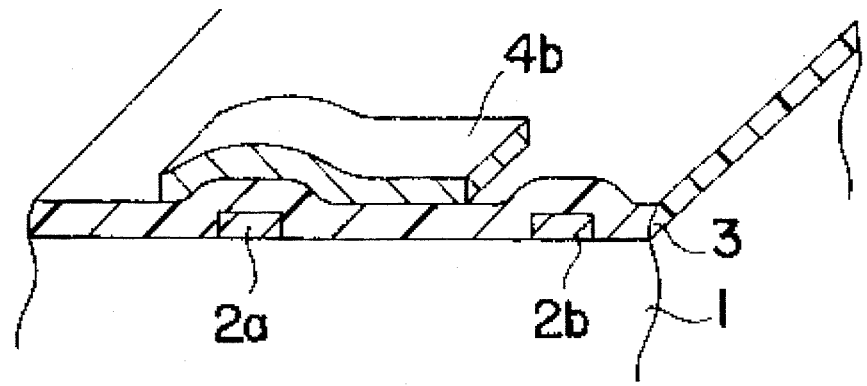

Next, the wiring metal layer 4a is patterned by ion milling, employing the resist pattern 5a as a mask, thereby producing the first second kind layer wiring 4b of a predetermined length, and thereafter, the resist pattern 5a is removed, resulting in the state shown in FIG. 1(b).

Figure 1C:
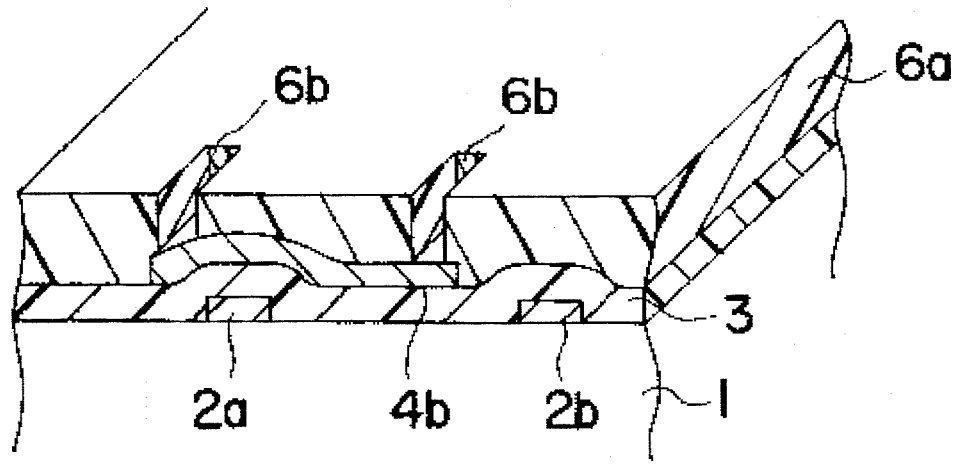

Subsequently, a resist pattern 6a is formed on the surface of the first second kind layer wiring 4b and the surface of the insulating film 3 so that apertures 6b remain at ends of the first second kind layer wiring 4b, as shown in FIG. 1(c).

Next, a gilding feeding layer 7 0.2 to 0.5 μm thick, comprising laminations of Ti/Au is deposited and formed on the surface of the resist pattern 6a and on the surfaces of the first second kind layer wiring 4b which are exposed at the bottom parts of the apertures 6b, thereafter, as shown in FIG. 2(a), a resist pattern 8b is formed on the surface of the gilding feeding layer 7 with apertures 8c extending from portions of the gilding feeding layer 7 at the ends of the first second kind layer wiring 4b toward on portions of the gilding feeding layer 7 that are not opposite the first second kind layer wiring 4b. An aperture 8a extends from a part of the gilding feeding layer 7 that is not opposite the first second kind layer wiring 4b toward a part of the gilding feeding layer 7 on the central part of the first second kind layer wiring 4b.

Next, as shown in FIG. 2(b), employing the resist pattern 8b as a mask, an Au metal layer is deposited by electrolytic plating in the apertures 8a and 8c, thereby forming a third kind layer wiring 9 and a second second kind layer wiring 9a 1 to 5 μm thick.

Next, after removing the resist pattern 8b, as shown in FIG. 2(c) the portion of the gilding feeding layer 7 which is covered by the resist pattern 8b is etched and removed by ion milling. Then, the third kind layer wiring 9 and the second second kind layer wiring 9a are also etched, but there is no unfavorable influences because the thickness, i.e., 1 to 5 μm, of the third kind layer wiring 9 and the second second kind layer wiring 9a is considerably larger than the thickness, i.e., 0.2 to 0.5 μm, of the gilding feeding layer 7.

Finally, the resist pattern 6a is removed, thereby resulting a multi-layer wiring structure in the state shown in FIG. 2(d).

In the manufacturing process of this embodiment, a first second kind layer wiring 4b of a predetermined length is formed on the insulating film covering the first kind layer wirings 2a and 2b so as to cross the first kind layer wiring 2a via the insulating film 3, then the second second kind layer wiring 9a, a part of which is connected with the first second kind layer wiring 4b and which crosses the first kind layer wiring 2b in an airbridge structure and the third kind layer wiring 9 crossing the first second kind layer wiring 4b in an airbridge structure are produced at the same time by selective plating, employing the resist pattern 8b as a mask. Therefore, a multi-layer wiring having the crossing part of the second kind layer wiring 4b and the third kind layer wiring 9 in an airbridge structure crossing part of the first kind layer wiring 2b and having the second second kind layer wiring 9a in an airbridge structure, is obtained by the same number of process steps as in the prior art method shown in FIGS. 3(a) through 4(b). Therefore, a multi-layer wiring structure that has reduced interlayer capacitance in the entirety of the multi-layer wiring structure can be obtained by the same number of process steps as in the prior art, and an improvement in the operation characteristics such as enhancement of operation speed in a semiconductor device is obtained.

While in the above-described embodiment, the first second kind layer wiring 4b crossing the third kind layer wiring 9 is formed in a region crossing the first kind layer wiring 2a at the surface of the insulating film 3 via the insulating film 3, the formation position of the first second kind layer wiring 4b is determined by considering the relation between that formation position and the formation position of semiconductor elements such as FETs which are, although not shown here, produced at a surface layer portion of the semiconductor substrate 1. Therefore, in the present invention, the formation position of the first second kind layer wiring 4b may be placed at a region on the surface of the insulating film 3 which does not cross the first kind layer wirings 2a and 2b because of the relation between that formation position and the formation position of the semiconductor elements formed at the surface layer portion of the semiconductor substrate 1. In this case, all the crossing portions of the first kind layer wiring and the second kind layer wiring can be formed in airbridge structures and the interlayer capacitances between the first kind layer wiring and the second kind layer wiring are further reduced.

As is evident from the foregoing description, according to a multi-layer wiring and a production method thereof of the present invention, a portion of the second kind layer wiring other than the portion that crosses the third kind layer wiring in an airbridge structure, is produced in an airbridge structure crossing the first kind layer wiring in producing the third kind layer wiring. Therefore, at least one of the crossing parts between the first kind layer wiring and the second kind layer wiring can be an airbridge structure, and as a result, a multi-layer wiring that has reduced the inter-layer capacitance over the whole of the multi-layer wiring structure relative to the prior art device is obtained by the same number of process steps as in the prior art method.

What is claimed is:

1. A semiconductor device wiring structure including:

a semiconductor substrate having a surface;

a first wiring layer disposed on and contacting part of the surface;

a first electrically insulating film disposed on and contacting the surface and the first wiring layer, covering the first wiring layer;

a second wiring layer disposed on and contacting the first electrically insulating film, part of the second wiring layer being disposed directly opposite and crossing the first wiring layer, the first wiring layer being electrically insulated from the second wiring layer by the first electrically insulating film; and a third wiring layer having generally coplanar first, second, and third parts, the first part and the second part being spaced apart from each other, having respective ends transverse to the surface, extending in opposite directions from the respective ends, and spaced from the first electrically insulating film by respective air gaps, each of the first part and the second part including a respective leg extending from proximate the respective ends, transverse to the surface, to and contacting respective parts of the second wiring layer, thereby electrically connecting the first and second parts together through the legs and the second wiring layer, the third part being disposed between the first and second parts, opposite the respective ends of the first and second parts, spaced and electrically insulated from the first and second parts and from the second wiring layer by respective air gaps and extending in a direction transverse to the directions of the first and second parts.

2. The wiring structure of claim 1 wherein the first and second parts of the third wiring layer comprise laminated films of titanium and gold.

3. The semiconductor wiring device of claim 1 wherein the first, second, and third parts of the third wiring layer are simultaneously formed in the same process.

4. The semiconductor wiring device of claim 1 wherein the first and second parts of the third wiring layer carry one of a power supply current and an electrical signal and the third part of the third wiring layer carries the other of the power supply current and the electrical signal.

5. The semiconductor wiring device of claim 1 wherein the third part of the third wiring layer is disposed opposite a part of the second wiring layer electrically connecting the legs of the first and second parts of the third wiring layer.

* * * * *